United States Patent [19]

Wu et al.

[11] Patent Number: 5,684,733
[45] Date of Patent: Nov. 4, 1997

[54] FIXED RESISTANCE HIGH DENSITY PARALLEL ROM DEVICE

[75] Inventors: Chi-Yung Wu, Hsin-Chu, Taiwan; Ling Chen, Sunnyvale, Calif.; Tong Peng, Meow-Lee, Taiwan

[73] Assignee: Holtek Microelectronics, Inc., China

[21] Appl. No.: 722,303

[22] Filed: Sep. 30, 1996

[51] Int. Cl.⁶ .................................................. G11C 13/00
[52] U.S. Cl. .................................... 365/100; 365/51
[58] Field of Search ........................... 365/100, 189.01, 365/51

[56] References Cited

U.S. PATENT DOCUMENTS 5,499,208  3/1996  Shoji .......................... 365/100

*Primary Examiner*—Terrell W. Fears
*Attorney, Agent, or Firm*—Barnes, Kisselle, Raisch, Choate, Whittemore & Hulbert, P.C.

[57] ABSTRACT

The present invention provides a fixed resistance sense-routed high density parallel ROM device for maintaining the resistance of a buried N+ region on a sense route constant. When data is read from a ROM cell matrix, the selection of different ROM cell transistors does not change the resistance of the buried N+ region on the sense route and thus enables a simplified design of a sense amplifier. The inactive select gate or transfer gate that is activated by the select line can be isolated by ion implantation for forming a buried P+ isolation and thus avoiding the narrowing or the cutting-off of the width of the active transfer gate or select gate due to ion diffusion.

9 Claims, 6 Drawing Sheets

FIXED RESISTANCE HIGH DENSITY PARALLEL ROM DEVICE

FIELD OF THE INVENTION

The present invention generally relates to a fixed resistance high density parallel read only memory (ROM) device and more particularly, relates to an easy-to-manufacture and easy-to-control high density, high speed ROM device in which the resistance of a buried N+ region on a sense route does not change when different ROM cell transistors are selected and an ion implantation technique is used to form an isolation of a buried P+ region and furthermore, the width of the transfer gate or the select gate are not narrowed or cut off due to ion diffusion.

BACKGROUND OF THE INVENTION

In a conventional ROM device, a stored data code of the mask ROM is determined by an ion implantation method. The cell array of ROM can be arranged in parallel, in series or in combined parallel/series array. One advantage of the parallel array structure is that the procedure for data code implantation is carried out at a later stage of the manufacturing process, thus the time between a user defines his data code and a manufacturer's delivery date is relatively short. This is compared to the series and the combined series/parallel array structure where the procedure for data code implantation is carried out at an early stage of the manufacturing process, and thus the time between a user defines his data code and a manufacturer's delivery date is about twice as long.

The conventional mask ROM described above requires field oxide isolations arranged in between active regions in a cell. However, the active pitch is limited by the bird's beak problem associated with the field oxide and thus can not be designed to achieve a minimum size. For example, the minimum pitch in a 0.8 micron integrated circuit routing rule is 1.6 micron (0.8 micron width+0.8 micron distance), while the active pitch is 2.2 micron (0.8 micron+1.4 micron distance). The active pitch deviates from the minimum pitch by 1.375 times. It is therefore a common objective of semiconductor manufacturers to develop a ROM device that has the highest density, the best reliability and the easiest manufacturability.

Referring initially to FIGS. 1 and 2 where a conventional high density parallel ROM circuit layout diagram and an equivalent circuit diagram are shown. The ROM cell matrix is a N×M cell matrix structured formed by N polysilicon of $WL'_1$, $WL'_2$, ... $WL'_N$ and M+1 buried N+ regions of $SB'_1$, $SB'_2$ ... $SB'_{M+1}$ perpendicularly crossing each other. Together with $BO_m$ and $BE_m$ top and bottom select lines, the ROM cell matrix can be expanded to form multiple memory blocks according to the user requirements. Furthermore, the insulation between the buried N+ regions of $SB'_4$, $SB'_3$ and 14 is achieved by an ion implantation process into region 16. However, in the ion planted region 16, the width of the transfer gate is often narrowed or even cut-off due to diffusion problems after the ion implantation step. Therefore, the fabrication process of the ROM device must be tightly controlled in order to maintain an acceptable level of reliability. A reduction in the width of the transfer gate also affects the access speed. In addition, the 45° metal wiring $MB_1$ increases the space occupied in the X-axis direction and further decreases the density of the ROM device.

FIG. 3 shows a schematic diagram for the read route of a conventional high density parallel ROM device. In order to read data in memory cell transistor $O_1$, $WL_1$ (in FIGS. 1 and 2) must be connected to a high electrical potential, $BO_m$ must be connected to a high electrical potential, $BE_m$ must be connected to a low electrical potential, metal wire $MB_1$ must be connected to ground, and metal wire $MB_2$ must be connected to sense amplifier 18. Based on the direction of current flow indicated in the diagram, the resistance on the read route to cell transistor $O_1$ is 2R while the resistance on the read route to cell transistor $O_2$ is 4R. Similarly, the resistance on the read route to cell transistor $O_n$ is 2NR, which is significantly larger than the resistances of 2R and 4R on the read route of the previous two cell transistors $O_1$ and $O_2$. Therefore, when reading data in ROM cell transistors in a conventional high density parallel ROM device, the resistance of buried N+ on the sense route varies with different ROM cell transistors selected. Under this circumstance, the design of the sense amplifier 18 is difficult and furthermore, variations in the manufacturing process cause circuit malfunctions and affect the product quality.

It is therefore an object of the present invention to set up a fixed resistance buried N+ region on the sense route of a ROM device such that when a ROM cell data is read, the resistance of a buried N+ region on the sense route is not changed due to the fact that a different ROM cell transistor is selected to read the data, and consequently the design of a sense amplifier can be simplified.

It is another object of the present invention that when insulating the inactive select gate of the transfer gate that are activated by the select line, an ion implantation process is used to form buried P+ isolation and thus avoiding the narrowing or the cutting-off of the width of the active transfer gate or the select gate due to ion diffusion and the resulting reduction in current and access speed.

It is a further object of the present invention to utilize a straight line metal wiring technique such that the density of the ROM device can be increased based on the space reduction gained by the metal wiring.

SUMMARY OF THE INVENTION

The present invention provides a fixed resistance high density parallel ROM device. The main objective is to maintain the resistance of a buried N+ region on a sense route constant. When data is read from a ROM cell matrix, the selection of different ROM cell transistors does not change the resistance of the buried N+ region on the sense route. This enables a simplified design of a sense amplifier. In addition, the inactive select gate or transfer gate that are activated by the select line can be isolated. The objective is achieved by a method of ion implantation to form a buried P+ isolation and thus avoiding the narrowing or the cutting-off of the width of the active transfer gate or the select gate (activated by the select line) due to ion diffusion. The manufacturing process for the ROM device can thus be simplified and the objective of high density and fast speed can be achieved.

BRIEF DESCRIPTION OF THE DRAWINGS

Other objects, features and advantages of the present invention will become apparent upon consideration of the specification and the appended drawings in which.

DETAILED DESCRIPTION OF THE PREFERRED EMBODIMENT

Figure 4:
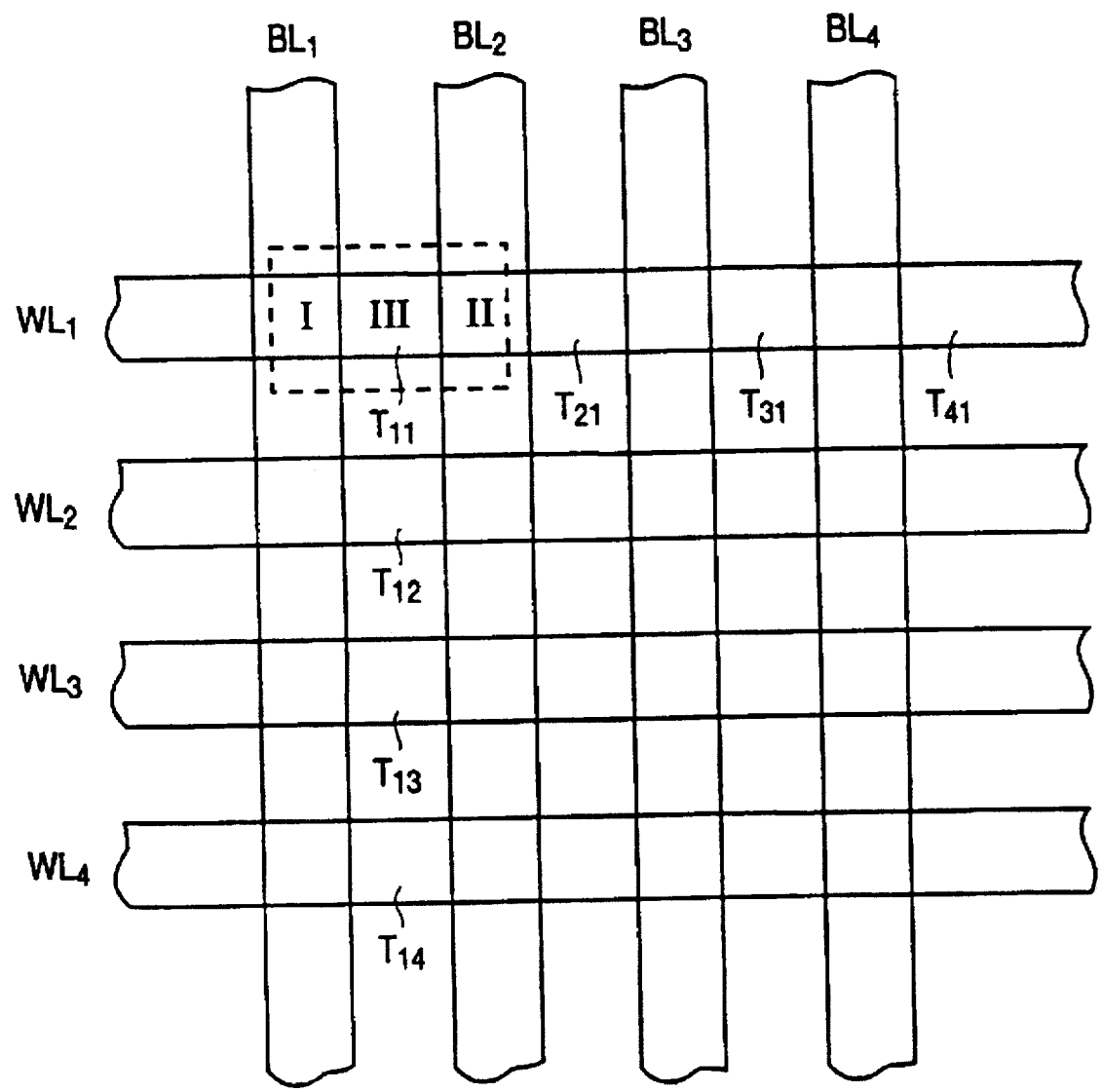
FIG. 4 is a buried N+ region layout diagram of the present invention fixed resistance high density parallel ROM device.

Reference is initially made to FIG. 4 where a buried N+ region routing diagram of the present invention fixed resistance high density parallel ROM device is shown. In this diagram, $T_{11}$ is a cell transistor which is formed by perpendicularly crossing a horizontal polysilicon word line $WL_1$ and two vertical buried N+ bit lines $BL_1$ and $BL_2$. The drain and the source of the cell transistor $T_{11}$ are located at the overlapping portion I and II of the polysilicon word line $WL_1$ and the buried N+ bit lines $BL_1$ and $BL_2$. The overlapping portion of the word line and the bit line is isolated by an oxide layer. The gate of cell transistor $T_{11}$ is located at III on the polysilicon word line $WL_1$. Similarly, it is perpendicularly crossed to a horizontal polysilicon word line and two vertical buried N+ bit lines to form cell transistors $T_{11}$, $T_{21}$, $T_{31}$, $T_{41}$. Therefore, the ROM cell matrix of the present invention can be formed by perpendicularly crossing more than one horizontal polysilicon word lines that are parallel to each other and more than one vertical buried N+ bit lines that are parallel to each other.

Figure 5:
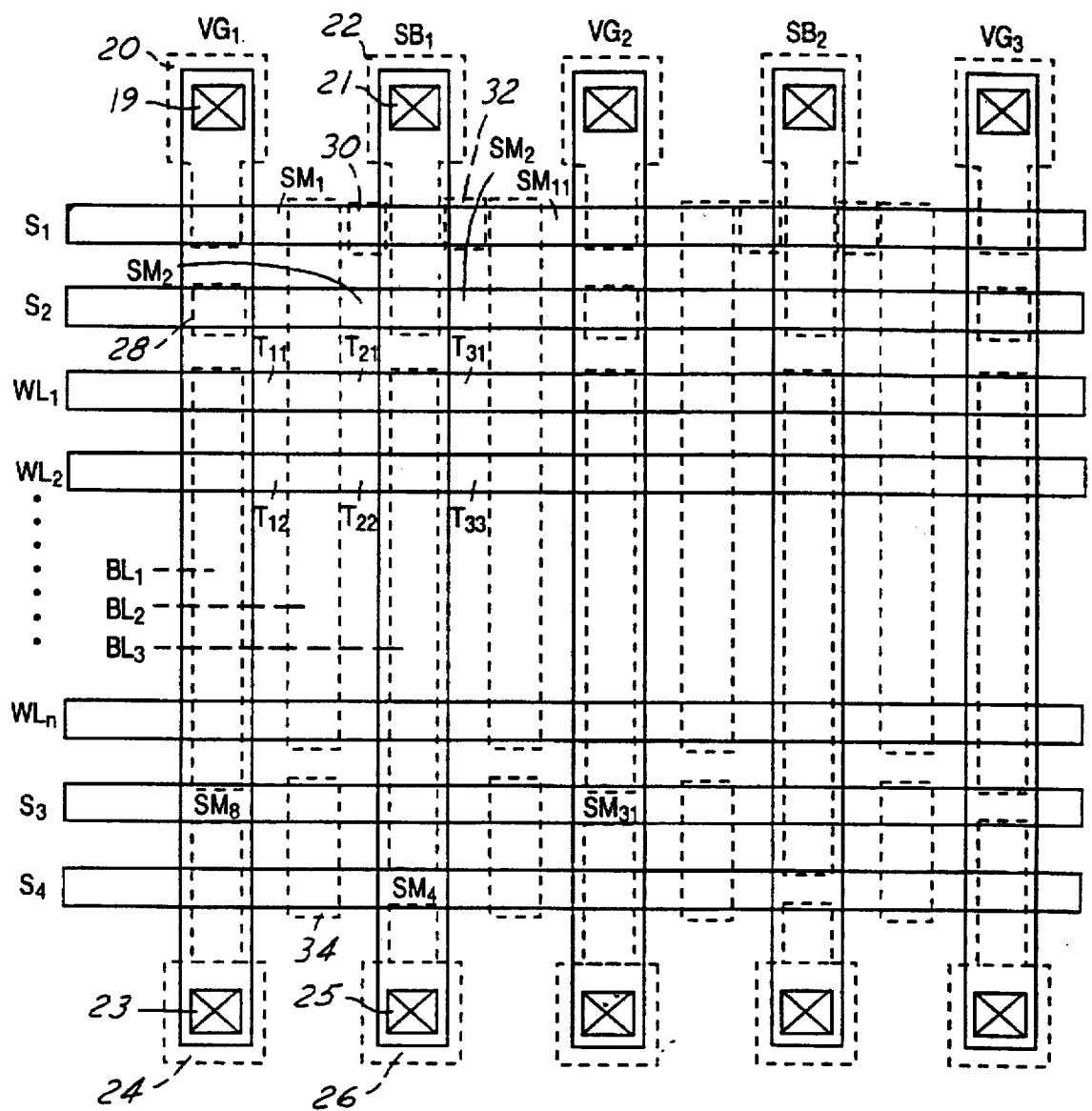
FIG. 5 is a circuit layout diagram of the present invention fixed resistance high density parallel ROM device.

Reference is now made to FIG. 5 which is a circuit layout diagram of the present invention fixed resistance high density parallel ROM device. In this diagram, there are two select lines above the ROM cell matrix and two select lines below the ROM cell matrix, that are perpendicular to bit lines $BL_1$ and $BL_2$, i.e., the first select line $S_1$, the second select line $S_2$, the third select line $S_3$ and the fourth select line $S_4$. They are used to select ROM memory block to achieve the goal of a high density expansion. In addition, the buried N+ bit lines $BL_1$, $BL_2$, and $BL_3$ in the above described ROM cell matrix include an extension region. For every other buried N+ bit line, the extension region extends either up to the top select line $S_1$ or $S_2$ above the ROM cell matrix, or down to the bottom select line $S_3$ or $S_4$ below the ROM cell matrix. The same buried N+ bit lines $BL_1$, $BL_2$, or $BL_3$ has only one up or one down extension region. As illustrated in FIG. 5, buried N+ $BL_1$ extends down to the third select line $S_3$, buried N+ $BL_2$ extends up to the first select line $S_1$, buried N+ $BL_3$ extends down to the fourth select line $S_4$, buried N+ $BL_4$ extends up to the first select line $S_1$, etc. On the surface of the top layer of every other buried N+, conductive metal wires $VG_1$, $SB_1$, $VG_2$, $_{SB2}$ and $VG_3$ are setup to electrically connect to outside circuit through metal contacts. Below the metal contacts of 19, 21, 23, and 25 on each conductive wires $VG_1$, $SB_1$, $VG_2$, and $SB_2$, the buried N+ 20, 22, 24, and 26 extend to the select lines $S_1$, $S_2$, $S_3$, and $S_4$. As shown in FIG. 5, buried N+ 20 extends to the first select line $S_1$ and buried N+ 24 extends to the third select line $S_3$ to form transistors $SM_1$ and $SM_3$ respectively. Buried N+ 22 extends to the second select line $S_2$, buried N+ 26 extends to the fourth select line $S_4$ to form transistors $SM_2$ and $SM_4$, respectively. Similarly, every other metal wire has the same routing. In addition, the insulation for the inactive select gates or transfer gates that are activated by the select lines $S_1$, $S_2$, $S_3$ and $S_4$ is achieved by an ion implantation method. The ion implantation method is used to form buried P+, 28, 30, 32, 34. The ion implantation in the buried P+ 28, 30, 32 is on the inactive select gate activated by the second select line $S_2$ and the first select line $S_1$, respectively. The ion implantation in the buried P+ 34 is on the inactive select gate activated by the third and the forth select lines $S_3$, $S_4$. By utilizing the insulation method of ion implantation in the buried P+ of the present invention, the neighboring regions of the ion implanted regions do not have active select gate or transfer gate. Therefore, ion diffusion would not cause the narrowing or cutting-off of the width of the select gate or the transfer gate.

Figure 6:
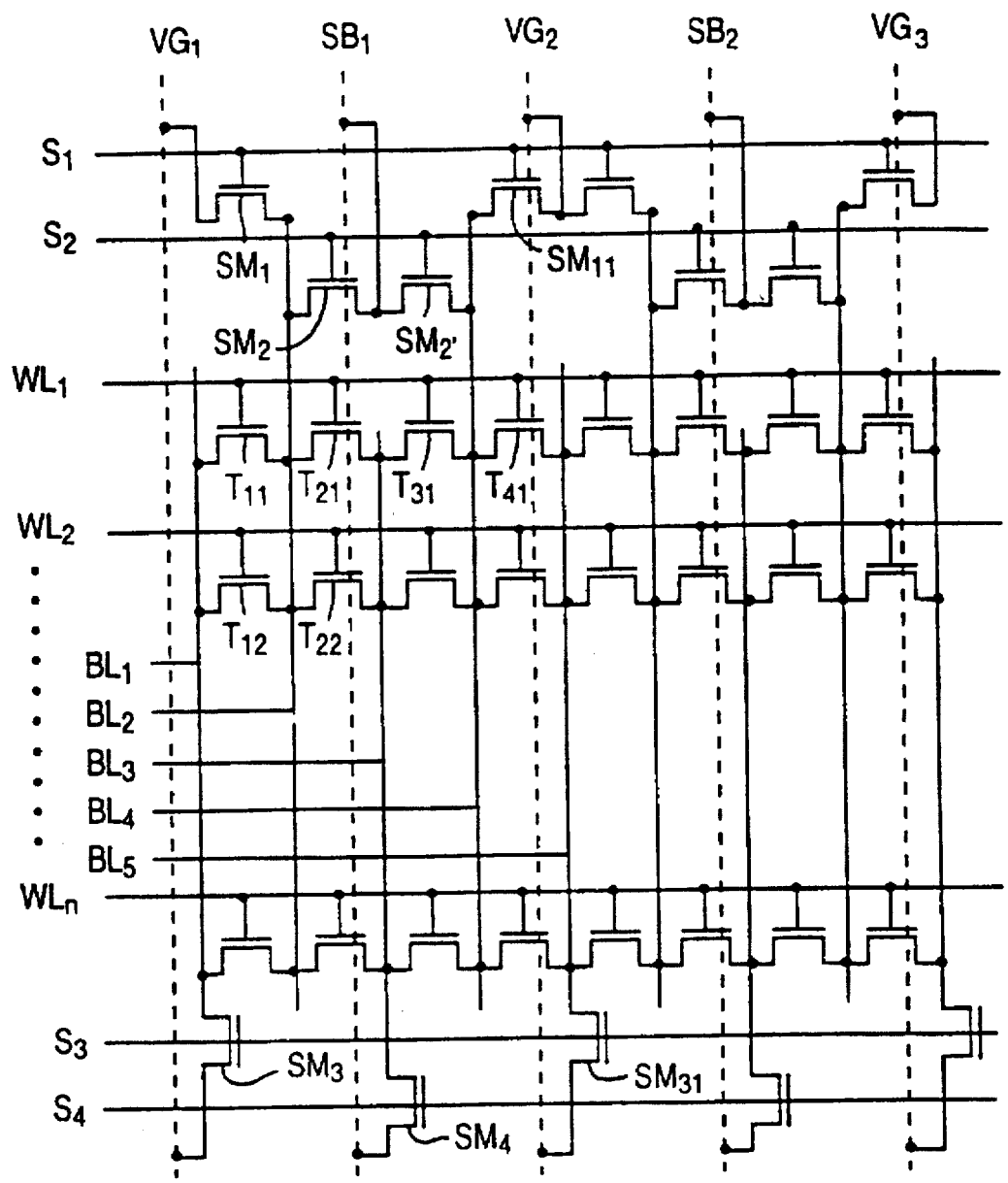
FIG. 6 is an equivalent circuit diagram of the present invention fixed resistance high density parallel ROM device.
Figure 7:
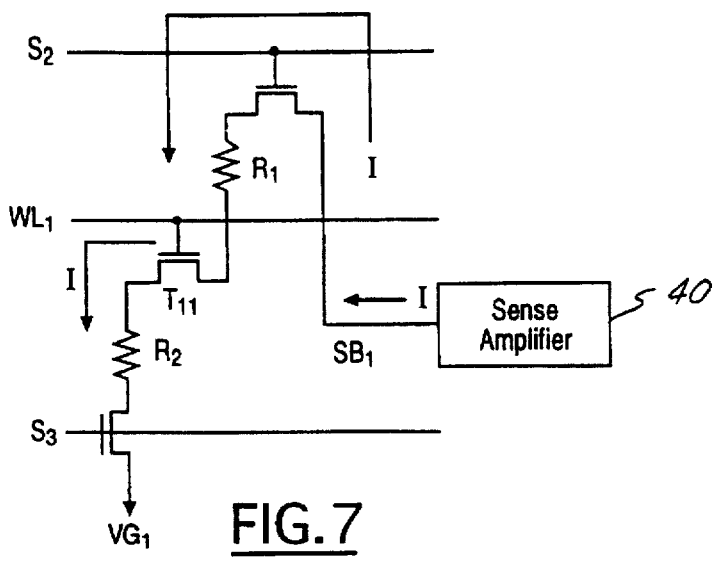
FIG. 7 is a read route schematic diagram of the present invention fixed resistance high density parallel ROM device.

FIG. 6 shows an equivalent circuit diagram for the present invention fixed resistance high density parallel ROM device. In the diagram, $SB_1$ and $SB_2$ are bit lines, $VG_1$, $VG_2$ and $VG_3$ are virtual ground, $WL_1$, $WL_2$ and $WL_n$ are word lines, and $S_1$, $S_2$, $S_3$ and $S_4$ are select lines. Each bit line can read data stored in four sets of cell transistors. Its read action can be described as follows:

To read data stored in cell transistor $T_{11}$—Connect the word line $WL_1$ on which the cell transistor $T_{11}$ is located to a high electrical potential. Keep the remaining word lines at a low potential. Connect select line $S_2$ to a high potential. This places select gate $SM_2$ in a connected state. As a result, the buried N+ bit line $BL_2$ is connected to bit line $SB_1$ via the already connected select gate transistor $SM_2$. The bit line $BL_1$ is also electrically connected to the sense amplifier (shown as 40 in FIG. 7) to output the sense result. In addition, connect the select line $S_3$ to a high potential to place the select gate $SM_3$ in a connected state. As a result, the buried N+ bit line $BL_1$ is connected to the virtual ground line $VG_1$ via the already connected select gate $SM_3$. The virtual ground VG is connected to the ground. Connecting low potential to select line $S_1$ and $S_4$ to block select gate $SM_1$ and $SM_4$. In addition, connect the bit line $SB_2$ and the virtual ground lines $VG_2$ and $VG_3$. The result is a simplified circuit diagram that is shown in FIG. 7. If cell transistor $T_{11}$ has a "high critical voltage", then the data read is "1". On the other hand, if the cell transistor $T_{11}$ has a "low critical voltage", the data read is "0".

To read data store in cell transistor $T_{21}$—Connect word line $WL_1$ on which the cell transistor $T_{21}$ is located to a high electrical potential. Keep the remaining word lines at a low potential. Connect the select line $S_2$ to a high electrical potential. This places the select gate $SM_1$ in a connected state. As a result, the buried N+ bit line $BL_2$ is connected to virtual ground line via the already connected select gate transistor $SM_1$. The virtual ground line $VG_1$ is also electrically connected to the ground. In addition, connect the select line $S_4$ to a high electrical potential to place the select gate $SM_4$ in a connected state. As a result, the buried N+ bit line $BL_3$ is connected to the bit line $SB_1$ via the already connected select gate $SM_4$. The virtual ground bit line $SB_1$ is also connected to the sense amplifier 40 to output the sense result. Connecting a low electrical potential to select lines $S_2$ and $S_3$ to block the select gate $SM_2$ and $SM_3$. In addition, connect the bit line $SB_2$ and the virtual ground lines $VG_2$ and $VG_3$. As described above, if cell transistor $T_{21}$ has a "high critical voltage", then the data read is "1". On the other hand, if the cell transistor $T_{21}$ has a "low critical voltage", the data read is "0".

To read data stored in cell transistor $T_{31}$—Connect word line $WL_1$ on which the cell transistor $T_{31}$ is located to a high electrical potential. Keep the remaining word lines at a low potential. Connect select line $S_1$ to a high electrical potential. This places the select gate $SM_{11}$ in a connected state. As a result, the buried N+ bit line $BL_4$ is connected to the virtual ground line $VG_2$ via the already connected select gate $SM_{11}$. Virtual ground line $VG_2$ is electrically connected to the ground. In addition, connect the select line S4 to a high electrical potential to place the select gate $SM_4$ in a connected state. As a result, the buried N+ bit line $BL_3$ is connected to the bit line $SB_1$ via the already connected select gate $SM_4$. The bit line $SB_1$ is connected to the sense amplifier to output the sense result. Also, connecting a low electrical potential to select lines $S_2$ and $S_3$ to block select gates $SM_2$ and $SM_3$. In addition, connect the bit line $SB_2$ and the virtual ground lines $VG_1$ and $VG_3$. As described above, if cell transistor $T_{31}$ has a "high critical voltage", the data read is "1". On the other hand, if the cell transistor $T_{31}$ has a "low critical voltage", then the data read is "0".

To read data stored in cell transistor $T_{41}$—Connect word line $WL_1$ on which the cell transistor $T_{41}$ is located to a high electrical potential. Keep the remaining word lines at a low potential. Connect select line $S_2$ to a high electrical potential. This places the select gate $SM'_2$ in a connected state. As a result, the buried N+ bit line $BL_4$ is connected to bit line $SB_1$ via the already connected select gate transistor $SM'_2$. The bit line $BL_1$ is also electrically connected to the sense amplifier (shown as 40 in FIG. 7) to output the sense result. In addition, connect the select line $S_3$ to a high electrical potential to place the select gate $SM_{31}$ in a connected state. As a result, the buried N+ bit line $BL_5$ is connected to the virtual ground line $VG_2$ via the already connected select gate $SM_{31}$. The virtual ground $VG_2$ is connected to the ground. Also, connecting a low electrical potential to select lines $S_1$ and $S_4$ to block the select gates $SM_{11}$ and $SM_4$. In addition, connect the bit line $SB_2$ and the virtual ground lines $VG_1$ and $VG_3$. As described above, if cell transistor $T_{41}$ has a "high critical voltage", the data read is "1". On the other hand, if the cell transistor $T_{41}$ has a "low critical voltage", then the data read is "0".

Figure 3:
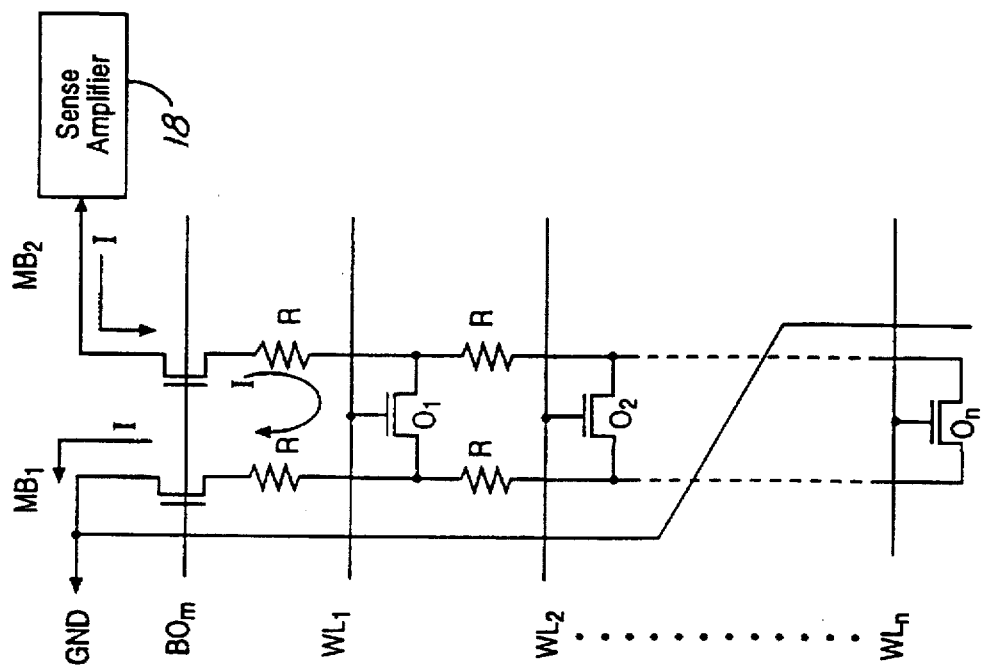
FIG. 3 is a read route schematic diagram of a conventional high density parallel ROM device.
Figure 2:
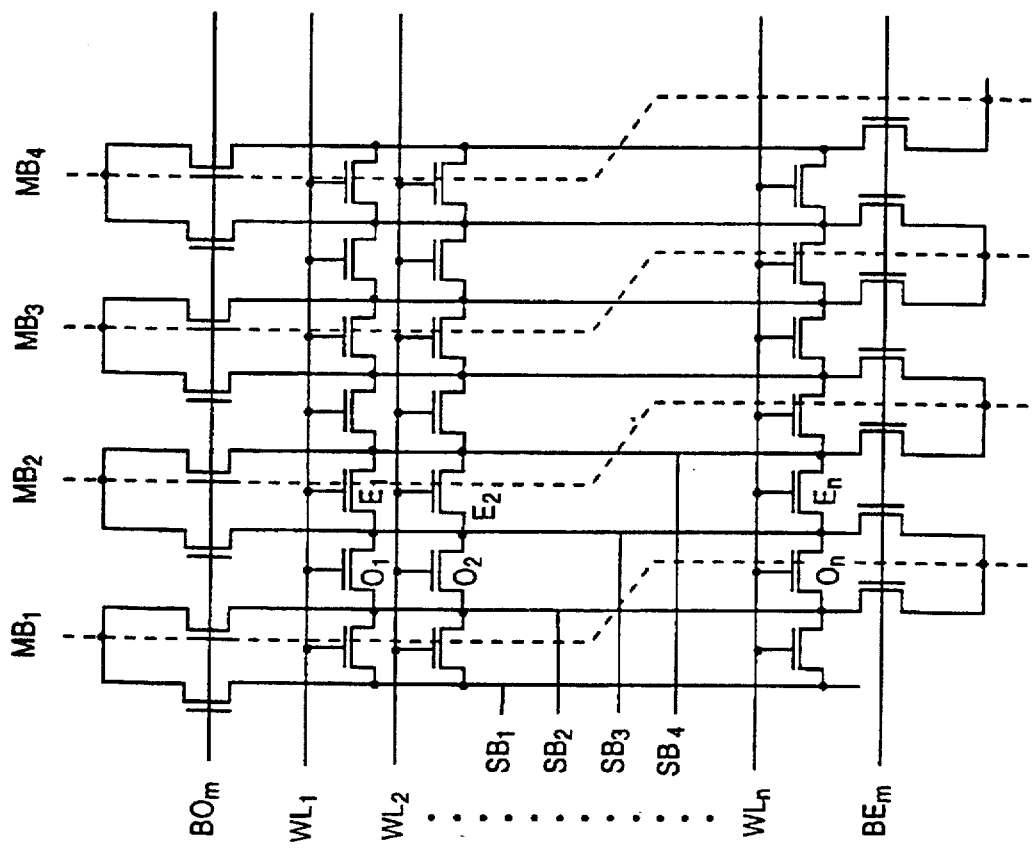
FIG. 2 is an equivalent circuit diagram of a conventional high density parallel ROM device.
Figure 8:
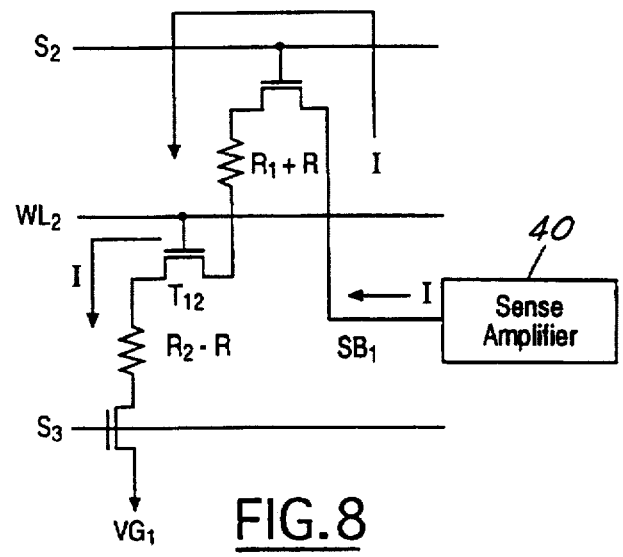
FIG. 8 is a second read route schematic diagram of the present invention fixed resistance high density parallel ROM device.
Figure 9:
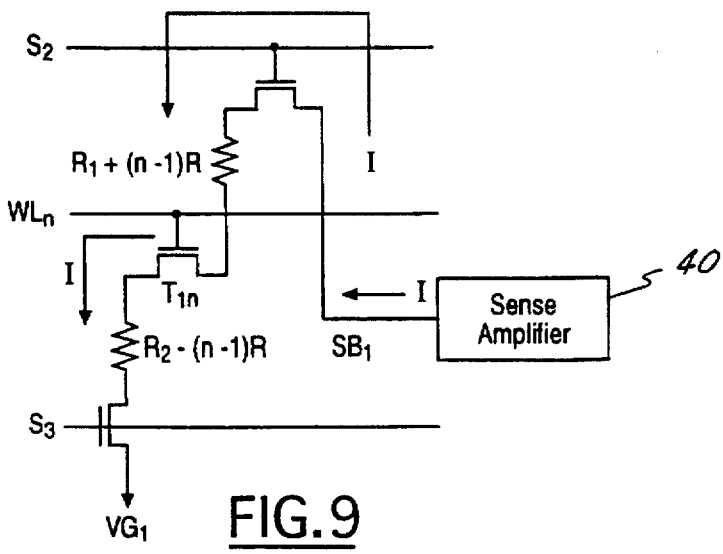
FIG. 9 is a third read route schematic diagram of the present invention fixed resistance high density parallel ROM device.

Data stored in other cell transistors can be read in a similar way. Compared with the conventional ROM device, the present invention provides the following enhanced functions. When reading data from cell transistors, the buried N+ resistance on the read route does not vary with the different cell transistors read. As shown in FIG. 7, to read data from cell transistor $T_{11}$, the buffed N+ resistance on the read route is R1+R2. As shown in FIG. 8, to read data from cell transistor $T_{12}$, the buried N+ resistance on the read route is [(R1+R)+(R2−R)]=R1+R2 (by setting the neighboring bit line resistance change on the read route to R). As shown in FIG. 9, to read data from cell transistor $T_{1n}$, the buried N+ resistance on the read route is {[R1+(n−1)R]+[R2−(n−1)R]}=R1+R2. Therefore, the resistance on any one of the cell transistor read routes is always R1+R2. This is in contrary to a conventional high density parallel ROM device that has select lines wherein the resistance on the route changes when different cell transistors are read (as shown in FIG. 3).

The insulation of the select gate or the transfer gate on the select line in the present invention device is accomplished by an ion implantation method in the region. However, because the ion implantation method implants in the buried P+, the neighboring regions of the ion implanted region do not have select gate or transfer gate in existence. Therefore, the width (or size) of the select gate or the transfer gate is not reduced or cut-off due to ion diffusion. As a result, the current is not reduced and the access speed is not to affected.

Figure 1:
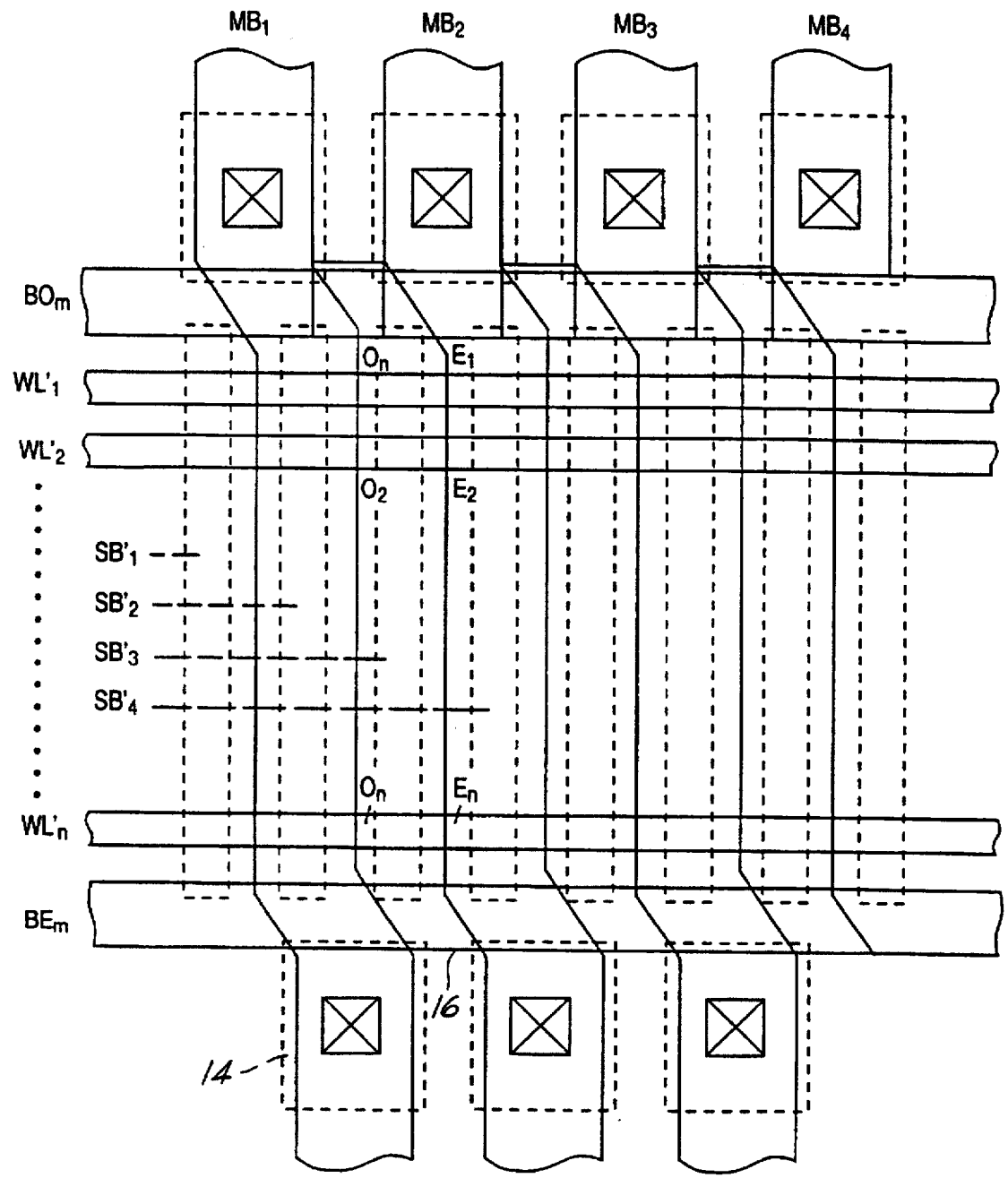
FIG. 1 is a circuit layout diagram of a conventional high density parallel ROM device.

In the conventional method, as shown in FIG. 1, the metal wiring is connected at a 45° angle. The method therefore wastes space in the x-axis direction and decreases the density of the ROM device. In the present invention device, the metal wiring is connected in a straight line method. It does not waste space and thus the density of the ROM device is improved.

The present invention device utilizes a fixed resistance buried N+ on a sense route such that when reading data from a ROM cell matrix, the buried N+ resistance on the sense route does not vary with the different cell transistors selected from the memory. In addition, to achieve insulation of the transfer gate or the select gate on the select line, an ion implantation method is employed to form buried P+ for isolation purpose. The neighboring regions of the ion implanted region do not have select gate or transfer gate. Therefore, the width (or size) of the select gate or the transfer gate are not reduced or cut-off due to ion diffusion. The present invention device therefore can be fabricated by a simplified manufacturing process to achieve a high density and high speed ROM.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. A fixed resistance high density parallel ROM device comprising:

a plurality of word lines formed of more than one horizontal polysilicons, said polysilicons being parallel to each other;

a plurality of bit lines, each of said bit lines being formed of a vertical buried N+ region, said plurality of bit lines being parallel to each other and perpendicularly crossing said word lines to form a ROM cell matrix;

a plurality of metal conducting wires positioned on a surface of a top layer of every other of said buried N+ regions, each of said wires being connected to a metal contact;

a plurality of select lines formed of polysilicons and situated above and below said ROM cell matrix for selecting a ROM region block;

a plurality of buried N+ extension regions, each of said buried N+ extension regions being situated below said metal contact and extending into said metal line; and a plurality of ion implanted regions formed by ion implanting into buried P+ regions for insulating inactive select and transfer gates on said select lines.

2. The memory device according to claim 1, wherein said plurality of select lines comprises two select lines arranged above said cell matrix and two select lines arranged below said cell matrix.

3. The memory device according to claim 1, wherein each of said buried N+ extension regions belongs to a respective one of said buried N+ bit lines, and in each adjacent pair of said buried N+ bit lines one of said buried N+ extension regions extends up to select lines of said plurality of select lines, whereas the other of said buried N+ extension regions extends down to select lines of said plurality of select lines.

4. The memory device according to claim 1, wherein said ion implanted region of buried P+ ion is only implanted into an inactive transfer gate on a single select line of said plurality of select lines.

5. The memory device according to claim 3, wherein each of said buried N+ extension regions only extends into one of said select lines.

6. The memory device according to claim 3, wherein each of said buried N+ extension regions extends into two of said select lines.

7. The memory device according to claim 1, wherein said ion implanted region of buried P+ ion is only implanted into an inactive select gate on a single select line of said plurality of select lines.

8. The memory device according to claim 1, wherein said ion implanted region of buried P+ ion is implanted into an inactive select gate on two select lines of said plurality of select lines.

9. The memory device according to claim 1, wherein said ion implanted region of buried P+ ion is only implanted into an inactive transfer gate on two select lines of said plurality of select lines.

* * * * *